(12) United States Patent
Tsorng et al.

(10) Patent No.: US 10,680,382 B2
(45) Date of Patent: Jun. 9, 2020

(54) MODULAR BRIDGE ARRAY FOR BRIDGING ELECTRONIC COMPONENTS

(71) Applicant: QUANTA COMPUTER INC., Taoyuan (TW)

(72) Inventors: Yaw-Tzorng Tsorng, Taoyuan (TW); Chun Chang, Taoyuan (TW); Ting-Kuang Pao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/256,117

(22) Filed: Jan. 24, 2019

(65) Prior Publication Data
US 2020/0067229 A1 Feb. 27, 2020

Related U.S. Application Data

(60) Provisional application No. 62/723,253, filed on Aug. 27, 2018.

(51) Int. Cl.
*H01R 13/518* (2006.01)
*H05K 7/14* (2006.01)
*H05K 1/14* (2006.01)

(52) U.S. Cl.
CPC .......... *H01R 13/518* (2013.01); *H05K 1/144* (2013.01); *H05K 7/1452* (2013.01);
(Continued)

(58) Field of Classification Search
CPC .. H01R 13/518; H05K 7/1452; H05K 7/1489; H05K 1/144; H05K 2201/10424;
(Continued)

(56) References Cited

U.S. PATENT DOCUMENTS 8,811,020 B2 * 8/2014 Song .................. G06F 1/183
312/223.1
8,861,222 B2 10/2014 Wen et al.
(Continued)

OTHER PUBLICATIONS

Extended European Search Report for EP Application No. 19185505.5, dated Jan. 30, 2020.

*Primary Examiner* — Rockshana D Chowdhury
(74) *Attorney, Agent, or Firm* — Nixon Peabody LLP; Zhou Lu

(57) ABSTRACT

A bridge array for connecting electronic components within a housing includes an array bracket and a plurality of connection modules coupled to the array bracket. Each connection module includes a first electrical connector configured to receive a first electronic component, and a second electrical connector configured to receive a second electronic component; thereby physically and electrically connecting the first electronic component and the second electronic component of each connection module. The array bracket includes a first electrical port electrically connected to the first electrical connector of each connection module. The first electrical port provides a common connection to the first electronic component of each connection module. The array bracket includes a second electrical port electrically connected to the second electrical connector of each connection module. The second electrical port provides a common connection to the second electronic component of each connection module.

18 Claims, 8 Drawing Sheets

(52) U.S. Cl.
CPC ..... *H05K 7/1489* (2013.01); *H05K 2201/042* (2013.01); *H05K 2201/10189* (2013.01); *H05K 2201/10409* (2013.01); *H05K 2201/10424* (2013.01); *H05K 2201/2018* (2013.01)

(58) Field of Classification Search
CPC ..... H05K 2201/2018; H05K 2201/042; H05K 2201/10189; H05K 2201/10409
See application file for complete search history.

(56) References Cited

U.S. PATENT DOCUMENTS

2007/0232089 A1   10/2007  Fung
2011/0300761 A1*  12/2011  Wang ................... H01R 31/005
                                                                   439/638

\* cited by examiner

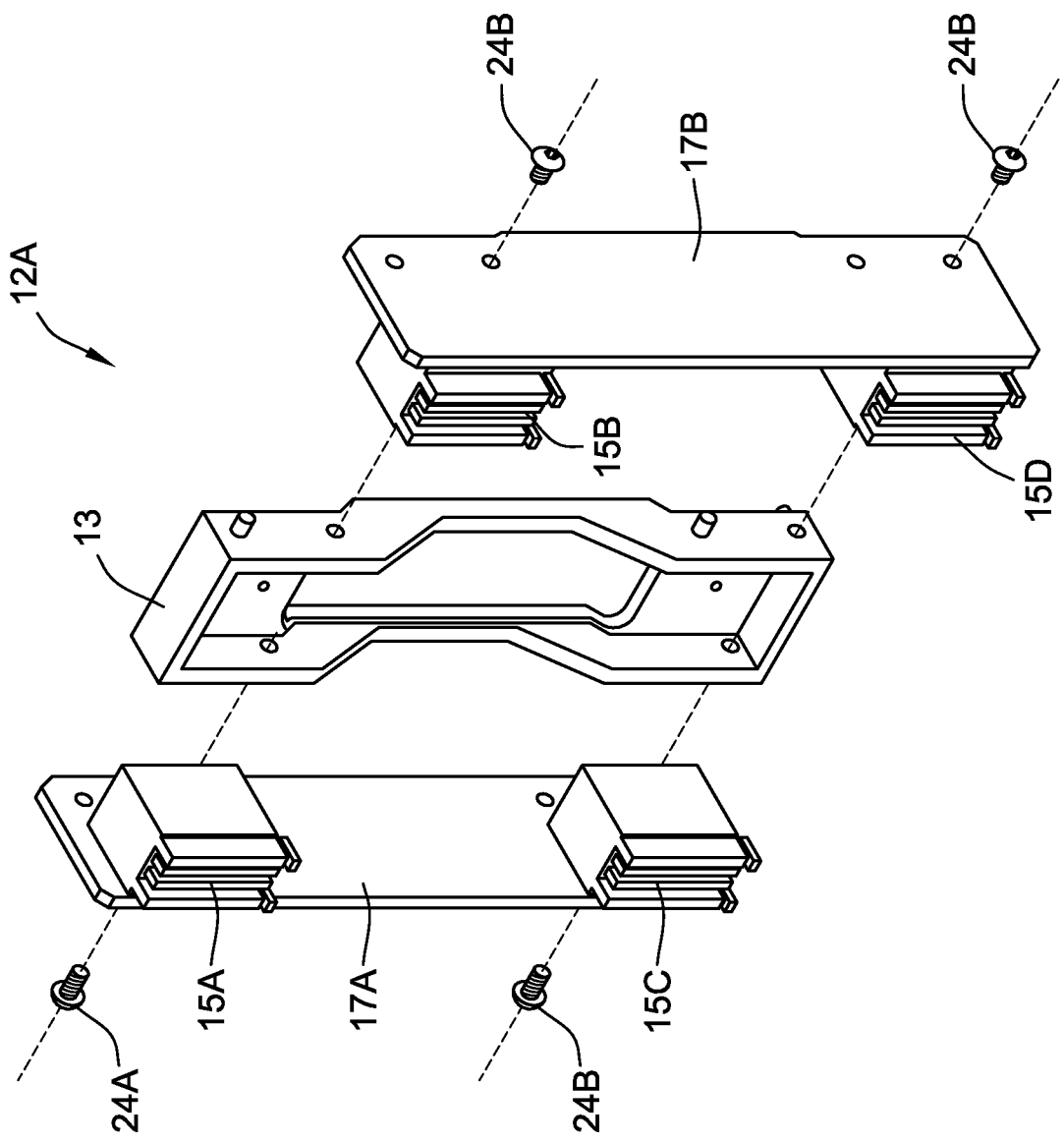
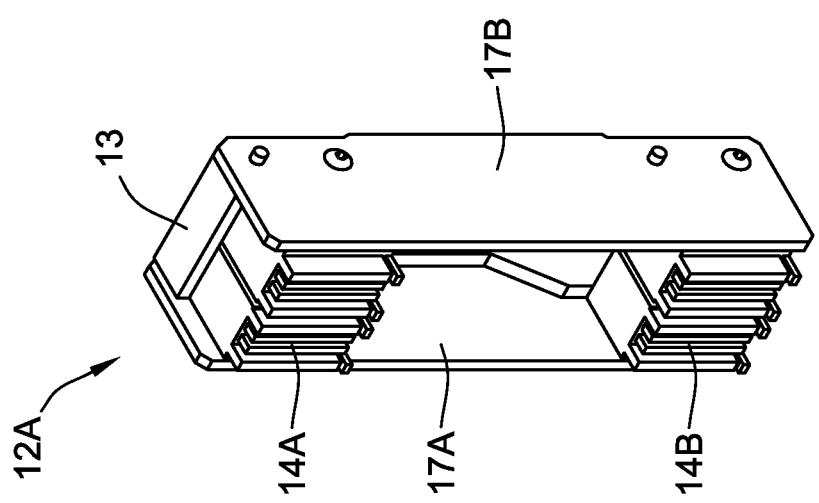
FIG. 2B
FIG. 2A

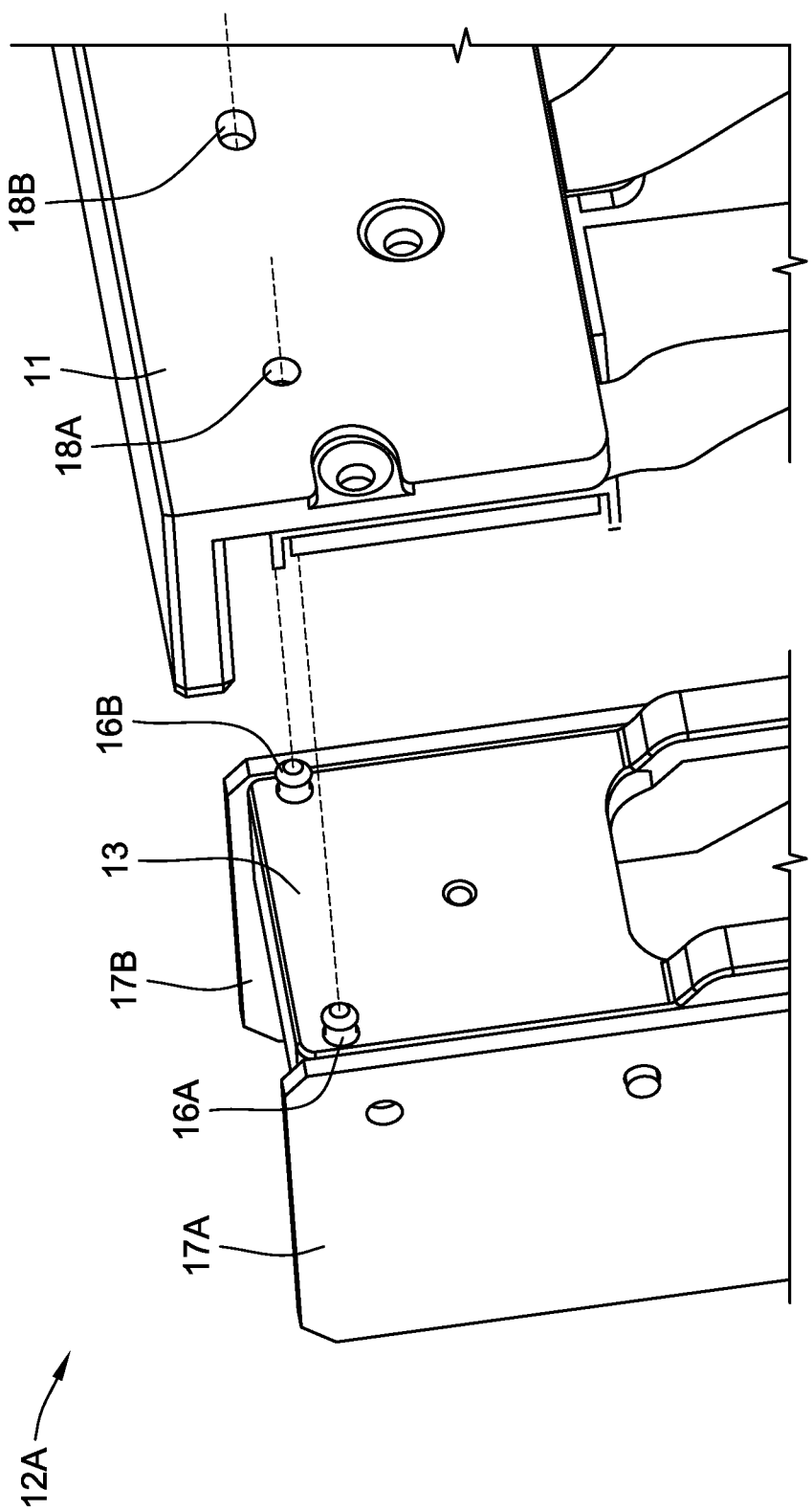

MODULAR BRIDGE ARRAY FOR BRIDGING ELECTRONIC COMPONENTS

CROSS-REFERENCE TO RELATED APPLICATIONS

This application claims priority under 35 U.S.C. § 119 to U.S. Provisional Application No. 62/723,253, entitled "CONVERTIBLE MODULE BRIDGE BOARDS ARRAY DESIGN", and filed on Aug. 27, 2018. The contents of that application are hereby incorporated by reference in their entirety.

TECHNICAL FIELD

The present disclosure relates generally to computing devices, and specifically to bridging two or more electronic components within a computing device.

BACKGROUND

Servers and other computing devices generally include a variety of different electronic components within a housing. For example, a server can include processing devices such as a central processing unit (CPU) or a graphics processing unit (GPU), hard drives, networking or communication components, memory devices, etc. These devices can be mounted in their own individual housings, or can be part of a printed circuit board assembly (PCBA). Depending on the specific needs of the system, pairs of electronic components can be electrically connected to allow for the exchange data with each other. However, for certain computing devices, individual connectors between electronic components can often provide an insufficient data transfer rate due to a lack of signal pins, and can present signal integrity issues. For example, high-end systems (such as a graphics processing system), require very large data transfer rates which individual connectors cannot handle. Individual connectors can also pose difficulties when attempting to precisely align a number of components or PCBAs within the housing. It can be difficult to position the connectors in the proper alignment, and movement of any of the components can potentially cause mechanical failures in the individual connectors. Thus, the electronic components and PCBAs within a computing device must be interconnected (as needed) in a manner that provides an acceptable level of signal integrity and an acceptable data transfer rate. The interconnection must also ensure the physical integrity of the components and the connections. The present disclosure is directed to solving these and other problems.

SUMMARY

The various examples of the present disclosure are directed towards devices and systems for connecting electronic components. In a first embodiment of the present disclosure, a device for connecting electronic components comprises a frame member, a connecting member, and an array bracket. The connecting member is coupled to the frame member to form a connection module. The connection module is configured to physically and electrically connect a first electronic component with a second electronic component. The array bracket is configured to at least partially receive the connection module, and further configured to at least partially receive a plurality of additional connection modules.

In some examples of the first embodiment, each of the plurality of additional connection modules is the same as the connection modules.

In some examples of the first embodiment, the first electronic component is the same as the second electronic component.

In some examples of the first embodiment, the first electronic component is a storage device and the second electronic component is processing device.

In some examples of the first embodiment, the connecting member includes one or more printed circuit boards.

In some examples of the first embodiment, the connecting member includes two printed circuit boards coupled together via the frame member.

In some examples of the first embodiment, a first one of the plurality of additional connection modules is configured to bridge two of a first type of electronic component, and a second one of the plurality of additional connection modules is configured to bridge two of a second type of electronic component, the first type of electronic component being different from the second type of electronic component.

In some examples of the first embodiment, the connecting member includes a first electrical connector configured to receive the first electronic component, and a second electrical connector configured to receive the second electronic component.

In some examples of the first embodiment, the device further comprises a first electrical port and a second electrical port coupled to the array bracket.

In some examples of the first embodiment, the connecting member is electrically coupled with the first electrical port and the second electrical port responsive to the array bracket receiving the connection module.

In some examples of the first embodiment, the connecting member includes a first electrical connector and a second electrical connector.

In some examples of the first embodiment, the first electrical connector of the connecting member is electrically connected to the first electrical port and the second electrical connector of the connecting member is electrically connected to the second electrical port responsive to the array bracket receiving the connection module.

In some examples of the first embodiment, the connection module is configured to bridge the first electronic component and the second electronic component such that the first electronic component can transmit data to or receive data from the second electronic component.

In a second embodiment of the present disclosure, a device for connecting electronic components includes a plurality of frame members, a plurality of connecting members, and an array bracket. Each of the plurality of connecting members is coupled to a respective one of the plurality of frame members to form a plurality of connection modules. The plurality of connection modules is configured to receive a plurality of electronic components. Each of the plurality of connection modules is configured to physically and electrically connect a respective first one of the plurality of electronic components and a respective second one of the plurality of electronic components. The array bracket is configured to receive the plurality of connection modules.

In some examples of the second embodiment, the device further comprises a first electrical port and a second electrical port.

In some examples of the second embodiment, each of the plurality of connecting members is electrically connected to the first electrical port and the second electrical port.

In some examples of the second embodiment, the plurality of connecting members is configured to electrically connect each of the respective first ones of the plurality of electronic components to the first electrical port.

In some examples of the second embodiment, the plurality of connecting members is configured to electrically connect each of the respective second ones of the plurality of electronic components to the second electrical port.

In a third embodiment of the present disclosure, a system for connecting electronic components includes a housing, a plurality of electronic components mounted within the housing, and a bridge array mounted within the housing. The bridge array includes a plurality of frame members, a plurality of connecting members, and an array bracket. Each of the plurality of connecting members is coupled to a respective one of the plurality of frame members to form a plurality of connection modules. The plurality of connection modules is configured to receive a plurality of electronic components. Each of the plurality of connection modules is configured to physically and electrically connect a respective first one of the plurality of electronic components and a respective second one of the plurality of electronic components. The array bracket is configured to receive the plurality of connection modules.

In some examples of the third embodiment, the housing is configured to slidably receive the plurality of electronic components within the housing.

In some examples of the third embodiment, the bridge array is fixedly secured to the housing.

In some examples of the third embodiment, the housing is configured to slidably receive the bridge array within the housing.

The above summary is not intended to represent each embodiment or every aspect of the present disclosure. Rather, the foregoing summary merely provides an ex ample of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

FIG. 2A is a perspective view of a first implementation of a connection module for use with the bridge array of FIG. 1A, according to some aspects of the present disclosure;

FIG. 2B is an exploded perspective view of the implementation of the connection module of FIG. 2A, according to some aspects of the present disclosure;

FIG. 2C is a perspective view of an implementation of securing the connection module of FIG. 2A to an array bracket, according to some aspects of the present disclosure;

DETAILED DESCRIPTION

Figure 1A:
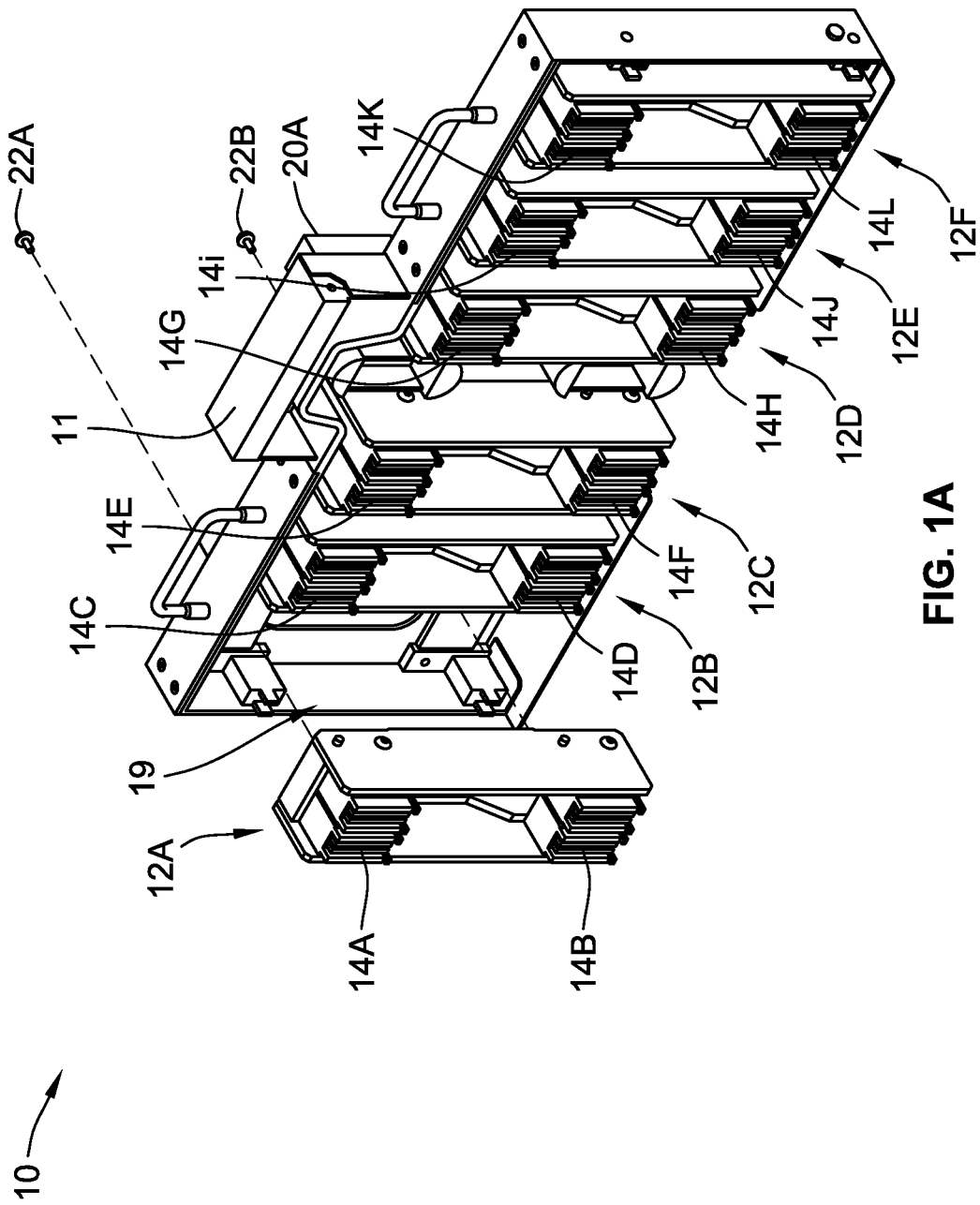
FIG. 1A is a perspective view of a first side of a bridge array, according to some aspects of the present disclosure.

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1B:
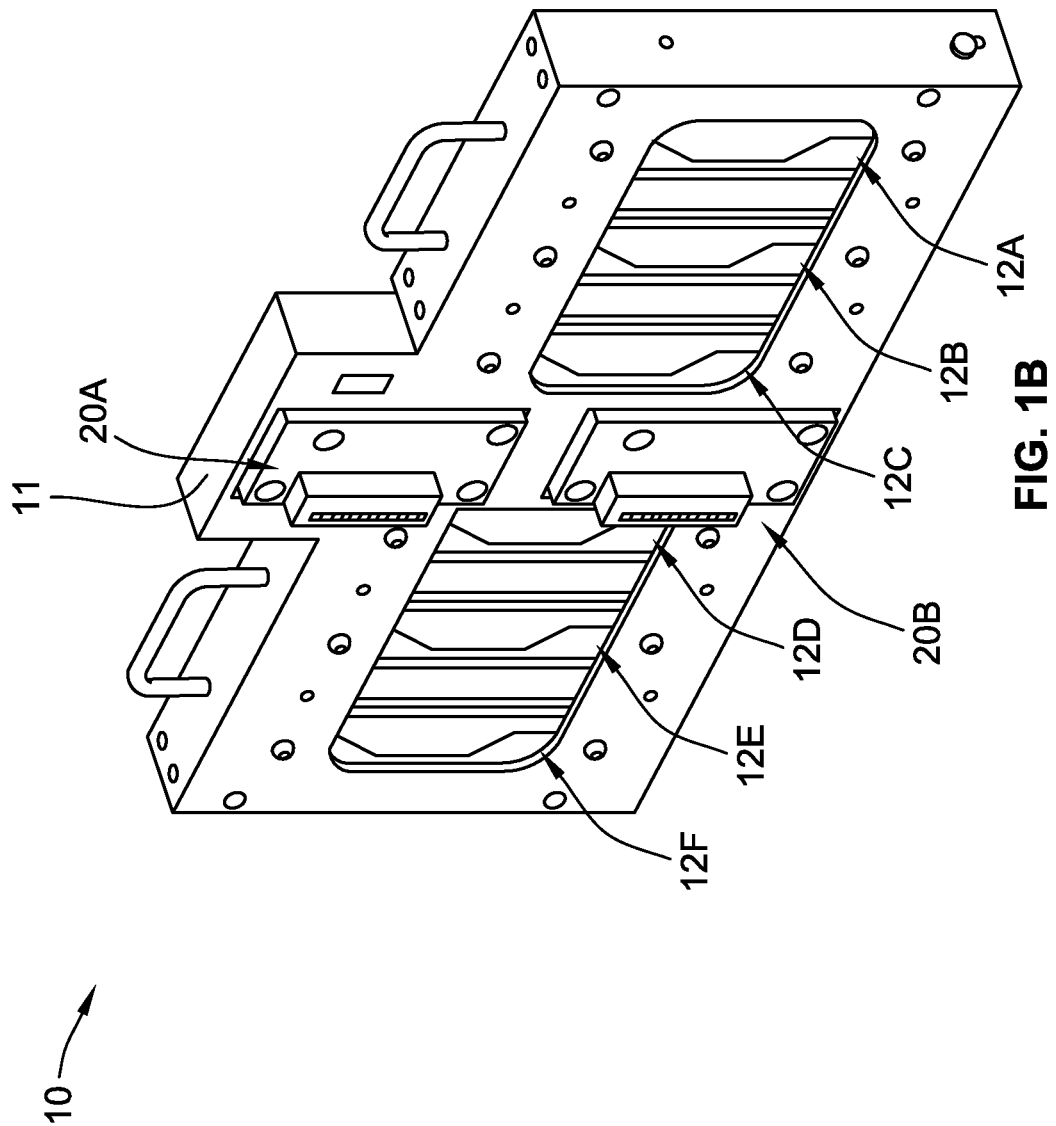
FIG. 1B is a perspective view of a second side of the bridge array of FIG. 1A, according to some aspects of the present disclosure.
Figure 3A:
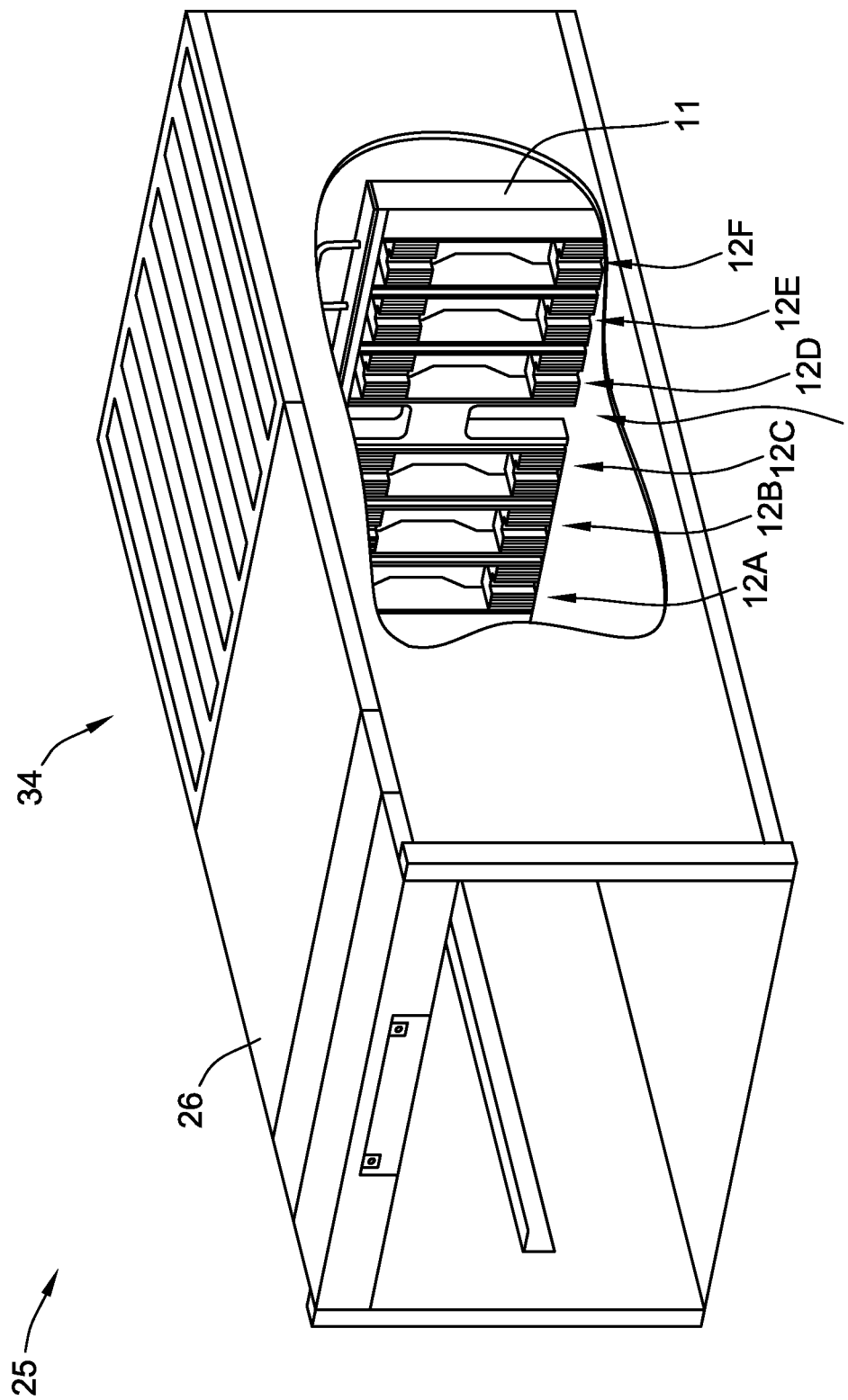
FIG. 3A is a perspective view of the bridge array of FIG. 1A being fixedly secured within the housing of a computing device, according to some aspects of the present disclosure.
Figure 3B:
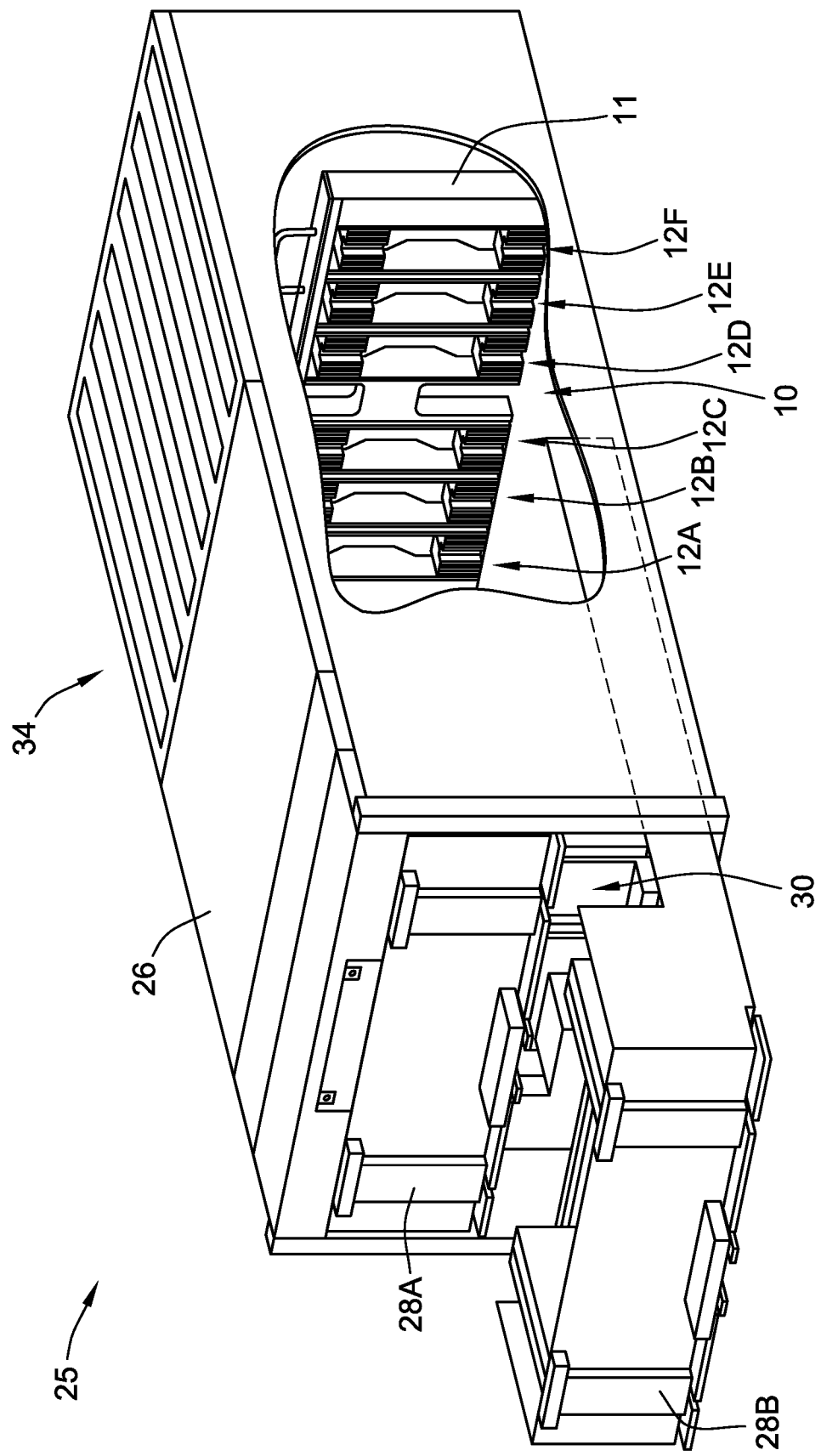
FIG. 3B is a perspective view of one or more electronic components being inserted into the housing of FIG. 3A, according to some aspects of the present disclosure.
Figure 4:
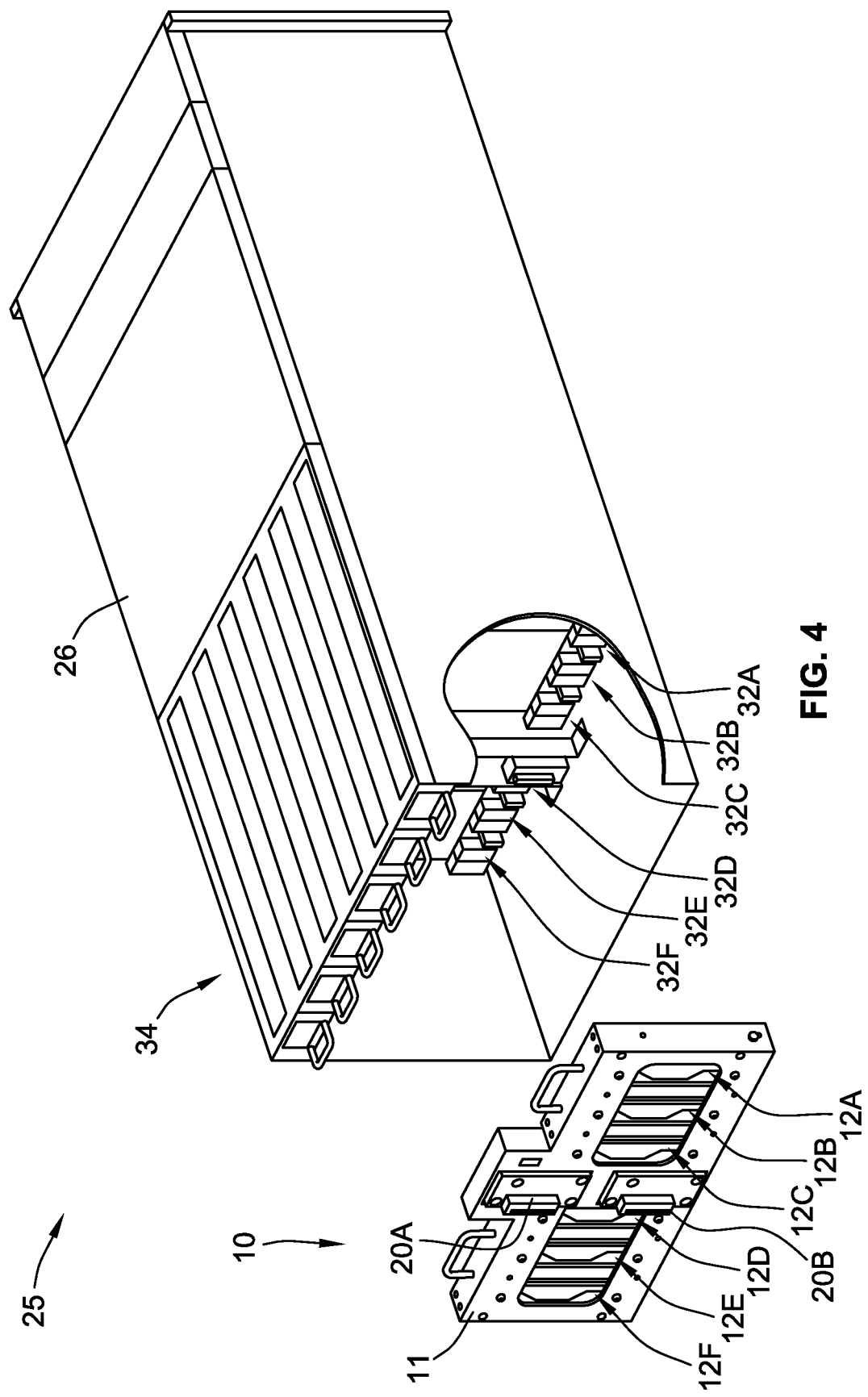
FIG. 4 is a perspective view of the bridge array of FIG. 1A being slidably coupled within the housing of a computing device, according to some aspects of the present disclosure.

FIG. 1A shows a bridge array 10 for bridging two or more electronic components within a system, such as a server or other computing device. FIG. 1B shows the bridge array 10 from the opposite side of the bridge array 10. Generally, the bridge array 10 and the electronic components (FIGS. 3B and 4) will be located within a housing (FIGS. 3A-4). The bridge array 10 includes an array bracket 11 and a plurality of connection modules 12A-12F. Each of the connection modules 12A-12F is configured to be coupled to the array bracket 11. As shown in FIG. 1A, the connection modules 12A-12F are configured to be received at least partially within an interior space 19 defined by the array bracket 11.

As further shown in FIG. 1A, the connection modules 12A-12F include a plurality of electrical connectors 14A-14L, that are used to connect electronic components. Generally, each of the connection modules 12A-12F include two of the electrical connectors 14A-14L. In this arrangement, two electronic components can be connected to or plugged into each of the connection modules 12A-12F. In some implementations, the electrical connectors 14A-14L provide a USB connection, a PCIE connection, an RF connection, a Digital Visual Interface (DVI) connection, a DisplayPort connection, a SATA connection, an mSata connection, an eSATA connection, a PS/2 connection, a serial connection, a DE-9 connection, an SCSI connection, an SAS connection, a power connection, a U.2 connection, an M.2 connection, or any other suitable electrical connection.

Each connection module 12A-12F is generally made of one or more customizable printed circuit boards. The connection modules 12A-12F are configured to bridge the two electric components that are connected to each of the connection modules 12A-12F. Thus, two electronic components can be plugged into or otherwise connected to each of the connection modules 12A-12F to physically and electrically couple the two electronic components together. Generally, any two electronic components that are connected to one of the connection modules 12A-12F can communicate with each other by sending or receiving data via the one connection module and its associated electrical connectors.

By using printed circuit boards, the connection modules 12A-12F can generally provide more data channels between the two electronic components connected to any one of the connection modules 12A-12F. This allows for more data to be transferred between two electronic components, and/or for data to be transferred between the two electronic components at a higher rate. Moreover, the printed circuit boards of the connection modules 12A-12F can provide precise alignments for high-density connectors. This can prevent pins from being misaligned during the mating process. And because all of the necessary connections are integrated into the connection modules, the process of physically connecting different components is simplified.

Further, the use of the connection modules 12A-12F allows for greater cross-interface compatibility. Different components may have different interfaces. Standard methods of connecting these components may require the use of adaptors that can occupy large amounts of space and may transfer data at slower rates. By using the connection modules 12A-12F with customer circuit boards, two components with different interfaces can much more easily be connected to each other.

In other implementations, any number of electronic components can be bridged to provide communication between the electronic components. For example, in some implementations, one or more of the connection modules 12A-12F are configured to connect with three or more electronic components. In this implementation, any of the three or more electronic components can be configured to send data to, or receive date from, any other of the three or more electronic components. Generally, the connection modules 12A-12F are customizable depending on the specific needs of the computing device that is being utilized.

Each of the connection modules 12A-12F can be coupled or attached to the array bracket 11. This connection provides mechanical stability to the connection modules 12A-12F and any electronic components connected to the connection modules 12A-12F. The connection modules 12A-12F can be attached to the array bracket 11 using a variety of methods. In some implementations, the connection modules 12A-12F are attached to the array bracket 11 using one or more fasteners. FIG. 1A shows fasteners 22A and 22B that are used to attach connection modules 12A to the array bracket 11. Any of the fasteners, including fasteners 22A and 22B, can include screws, bolts, pins, clips, etc. In other implementations, the connection modules 12A-12F may be attached to the array bracket 11 via a snap-fit or press-fit connection. Other methods of physically attaching the connection modules 12A-12F to the array bracket 11 can also be used.

As illustrated in both FIG. 1A and FIG. 1B, the bridge array 10 further includes two electrical ports 20A (FIG. 1B) and 20B. The electrical ports 20A, 20B provide a common electrical connection to two or more of the electronic components. The electrical ports 20A, 20B can be electrically connected directly to the electronic components, or through the connection modules 12A-12F. The electrical ports 20A, 20B are generally positioned on a side of the array bracket 11 opposite the connection modules 12A-12F. The electrical ports 20A, 20B are configured to be electrically connected to the electrical connectors 14A-14L of the connection modules 12A-12F when the connection modules 12A-12F are received by the array bracket 11. By then connecting the electronic components to the electrical connectors 14A-14L of the connection modules 12A-12F, an electrical connection between the electrical ports 20A, 20B and the electronic components is created.

In one implementation, each of the electrical ports 20A, 20B is electrically connected to only one of the electrical connectors of each of the connection modules 12A-12F. In this implementation, the electrical port 20A is electrically connected to only the electrical connectors 14A, 14C, 14E, 14G, 14I, 14K. The electrical port 20B is electrically connected to only the electrical connectors 14B, 14D, 14F, 14H, 14J, 14L. In this manner, the electrical port 20A can thus be electrically connected to only the "top" electronic components that are connected to the connection modules 12A-12F. The electrical port 20B can correspondingly be electrically connected to only the "bottom" electronic components that are connected to the connection modules 12A-12F.

Other implementations can provide different electrical connections between the electrical ports 20A, 20B and the electrical connectors 14A-14L. For example, one of the electrical ports 20A, 20B can be configured to be electrically connected with electrical connectors 14A-14F, e.g., the electrical connectors of the "left" connection modules 12A-12C. The other one of the electrical ports 20A, 20B can be configured to be electrically connected with electrical connectors 14G-14L, e.g., the electrical connectors of the "right" connection modules 12D-12F. In still other implementations, both electrical ports 20A, 20B are connected to each of the electrical connectors 14A-14L. Other configurations of electrical connections between the electrical ports 20A, 20B and the connection modules 12A-12F are also possible.

The electrical ports 20A, 20B are thus configured to provide a common connection to two or more of the electronic components connected to the connection modules 12A-12F. In some implementations, one or both of the electrical ports 20A, 20B can be used to provide power to the electronic components connected to the connection modules 12A-12F. In other implementations, one or both of the electrical ports 20A, 20B can be used to provide data to the electronic components connected to the connection modules 12A-12F. In still other implementations, one of the electrical ports 20A, 20B provides power to some or all of the electronic components, while the other one of the electrical ports 20A, 20B provides data to some or all of the electronic components.

The electrical ports 20A, 20B can generally utilize any type of electrical connection or interface. For example, the electrical ports 20A, 20B can be USB ports, PCIe ports, standard power connectors, power bus bars. etc.

In some implementations, the connection modules 12A-12F are automatically electrically connected directly to the electrical ports 20A, 20B once the connection modules 12A-12F are coupled to the array bracket 11. For example, each of the connection modules 12A-12F may include electrically conductive portions that electrically connect the connection modules 12A-12F to the electrical ports when the connection modules 12A-12F are coupled to the array bracket 11. In other implementations, the connection modules 12A-12F are configured to be electrically connected to the electrical ports 20A, 20B via an electrically conductive component that is coupled to or formed with the array bracket 11. For example, the array bracket 11 may include a number of small printed circuit boards containing electrical traces that are mounted to the array bracket 11. When the connection modules 12A-12F are received by the array bracket 11, the connection modules 12A-12F form electrical connections to the electrical ports 20A, 20B via individual ones of the small printed circuit boards. The electrical traces can also be integrally formed with the array bracket 11. In other implementations, the connection modules 12A-12F may be electrically connected to the electrical ports 20A, 20B via wires mounted to the array bracket 11.

In still other implementations, the array bracket 11 may utilize different types of switches to electrically connect the individual components to the electrical ports 20A, 20B via the connection modules 12A-12F. For example, manually operated switches can be disposed anywhere in or around the array bracket 11. Each individual switch can be configured to connect one or more of the connection modules 12A-12F to one or both of the electrical ports 20A, 20B via any type of electrically conductive path described above, or by itself. The switches can have a manually-operable actuator, such as a push-button, a lever, a rotary shaft, a toggle, a rocker, etc. The actuator of the switches is generally accessible to a user while the electrical components connected to the array bracket 11 are in use. Once the connection modules 12A-12F are inserted into the array bracket 11, the user can actuate any of the switches to connect a desired one of the connection modules 12A-12F to the electrical ports 20A, 20B.

Detection switches can also be used to automatically connect the connection modules 12A-12F to the electrical ports 20A, 20B. These switches can be configured to detect either insertion of the connection modules 12A-12F into the array bracket 11, or the connection of the electronic components to the connection modules 12A-12F. In some implementations, the detection switches have a physical actuator that is pressed, turned, toggled, or otherwise activated in response to the connection modules 12A-12F being inserted into the array bracket 11. Alternatively, the detection switches may be activated in response to the electronic components to the connection modules 12A-12F.

For example, the detection switches may be located within the array bracket 11 and have a push-button actuator. When the connection modules 12A-12F are inserted into their slots in the array bracket 11, the connection modules 12A-12F physically press the push-button of the detection switches. The activated switches thus complete the electrical connection between the connection modules 12A-12F and the electrical ports 20A, 20B. In still other implementations, the detection switches may be optical or magnetic switches that detect the presence of the connection modules 12A-12F or the individual electronic components and connect the connection modules 12A-12F to the electrical ports 20A, 20B.

FIG. 2A shows a magnified view of one of the connection modules 12A, while FIG. 2B shows an exploded view of the connection module 12A. The connection module 12A generally comprises a first connecting member portion 17A and a second connecting member portion 17B that are coupled to a frame member 13. The connecting member portions 17A, 17B are printed circuit boards that are configured to attach to either side of the frame member 13 via fasteners 24A-24D. Fasteners 24A-24D can include screws, bolts, pins, clips, or any other suitable type of fastener. The connecting member portions 17A, 17B can also be configured to couple with the frame member 13 via a snap-fit or press-fit connection.

In some implementations, only the frame member 13 is secured to the array bracket 11 (FIGS. 1A and 1B) in order to couple the connection module 12A to the array bracket 11. In other implementations, only the connecting member portions 17A, 17B are secured to the array bracket. In still other implementations, both the frame member 13 and the connecting member portions 17A, 17B are secured to the array bracket.

As shown in FIG. 2B, each of the connecting member portions 17A, 17B include two electrical connector portions. Connecting member portion 17A includes electrical connector portions 15A and 15C. Connecting member portion 17B includes electrical connector portions 15B and 15D. When the connecting member portions 17A, 17B are coupled to the frame member 13, as shown in FIG. 2A, electrical connector portions 15A and 15B form electrical connector 14A, while electrical connector portions 15C and 15D form electrical connector 14B. Once the connection module 12A is assembled, the connection module 12A can be mounted in the array bracket 11 (FIGS. 1A and 1B).

In some implementations, the frame member 13 is made of an electrically insulating material and acts as a passive structural device. In these implementations, the connecting member portions 17A, 17B provide any necessary electrical connections between electronic components (FIGS. 3B and 4) and/or to the electrical ports of the array bracket (FIGS. 1A and 1B). In other implementations, the frame member 13 can include electrically conductive portions that assist in electrically connecting electronic devices to each other and/or to the electrical ports of the array bracket.

FIG. 2C shows an implementation for securing one of the connection modules 12A to the array bracket 11. In this implementation, the frame member 13 includes a pair fastener portions 16A and 16B. The fastener portions 16A, 16B extend from the frame member 13 toward the array bracket 11. The array bracket 11 defines a corresponding pair of fastener apertures 18A, 18B. The fastener apertures 18A, 18B are configured to mate with the fastener portions 16A, 16B of the frame member 13 to secure the connection modules 12A to the array bracket 11.

The fastener portions 16A, 16B are generally configured to snap into the fastener apertures 18A, 18B responsive to being pressed against the fastener apertures 18A, 18B. In other implementations however, the fastener portions 16A, 16B may be screwed into the fastener apertures 18A, 18B. In still other implementations, a separate component may attach to the fastener portions 16A, 16B on the opposite side of the array bracket 11 as the fastener portions 16A, 16B extend through the fastener apertures 18A, 18B. While FIG. 2C shows two fastener portions 16A, 16B and two fastener apertures 18A, 18B, each of the connection modules may have any number of fastener portions. The array bracket 11 may have any number of corresponding fastener apertures.

Any number of other types of mechanisms may also be used to secure the connection modules to the array bracket. For example, the connection modules may utilize latches or levers to secure the connection modules to the array bracket. The connection modules can also be configured to couple to the array bracket via a friction fit. The connection modules can also be secured to the array bracket using screws, nails, pins, bolts, clamps, etc.

FIGS. 3A and 3B show an implementation of a computing device 25 that can house the electronic components and the bridge array. The computing device 25 can be a server in some implementations. The computing device 25 includes a housing 26 in which the array bracket 11, the connection modules 12A-12F, and a number of electronic components 30 (FIG. 3B) can be placed. As shown in FIG. 3A, the array bracket 11 and the connection modules 12A-12F can be placed inside the housing 26 and secured to the housing 26. The array bracket 11 can be secured to the housing 26 using any suitable mechanism, such as screws, bolts, pins, clips, etc. FIGS. 3A and 3B thus show the bridge array 10 (including array bracket 11 and connection modules 12A-12F) acting as a stationary terminal for the electronic components. The computing device can generally be any type of computing device, such as standard computers or servers. In addition, any device involving large amounts of data and/or power transfer can generally benefit from this design, such as a power switch board or a mobile data/power center.

As shown in FIG. 3B, once the array bracket 11 and connection modules 12A-12F have been placed within the housing 26, component trays 28A, 28B containing one or more electronic components 30 can be slidably inserted into the housing 26. As the component trays 28A, 28B are inserted into the housing 26, the one or more electronic components 30 connect to the electrical connectors (FIG. 1A) of the connection modules 12A-12F. In some implementations, the bridge array 10 is accessible from the rear of the housing 26. One or more power supplies 34 can be mounted to the housing 26 and can be used to provide power to one or more of the electronic components 30, via the electrical ports in the bridge array 10.

FIG. 4 shows another implementation of a computing device 25 that houses the electronic components and the bridge array. In this implementation, the bridge array 10 (including array bracket 11 and connection modules 12A-12F) can be slidably coupled to the housing 26. In this implementation, the bridge array 10 is generally not fixedly secured within the housing 26 as in FIGS. 3A and 3B. Rather, the bridge array 10 in FIG. 4 is configured to be easily inserted into and removed from the housing 26 as needed. In this implementation, electronic components 32A-32E are generally placed into the housing 26 from one end of the housing 26. The bridge array 10 is then inserted into the housing 26 from the other end to connect the electronic components 32A-32E to the electrical connectors (FIG. 1A) of the connection modules 12A-12F. This configuration allows the bridge array 10 to be easily removed from the housing 26. FIG. 4 thus shows the bridge array 10 acting as a retractable terminal for the electronic components.

In the implementation of FIG. 4, the housing 26 can include one or more power supplies 34 mounted to the exterior of the housing 26. One or more of the power supplies 34 can be electrically connected to either of the electrical ports 20A, 20B of the bridge array 10 to provide power to any of the electronic components 32A-32E. In some implementations, the power supplies 34 can be electrically connected to a power supply board (power supply PCB) that is mounted within the housing 26. The power supply board can then be connected using power cables to the electrical ports 20A, 20B of the bridge array 10.

Figure 5A:
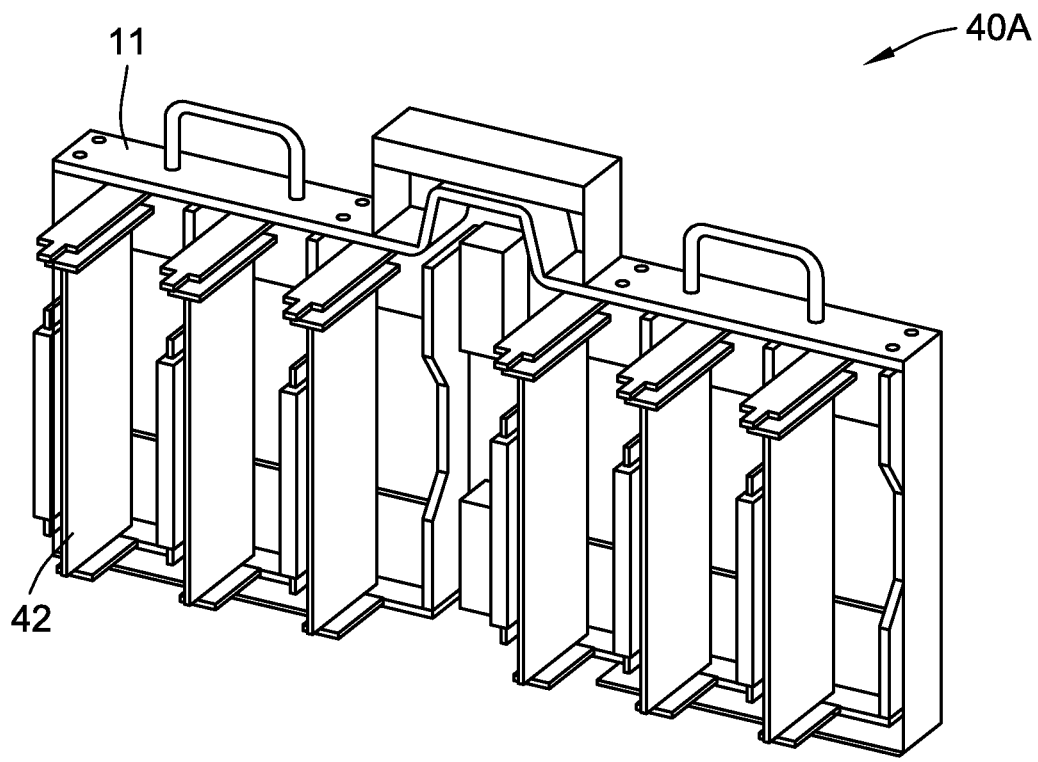
FIG. 5A is a perspective view of the bridge array of FIG. 1A with a second implementation of a connection module, according to some aspects of the present disclosure.
Figure 5B:
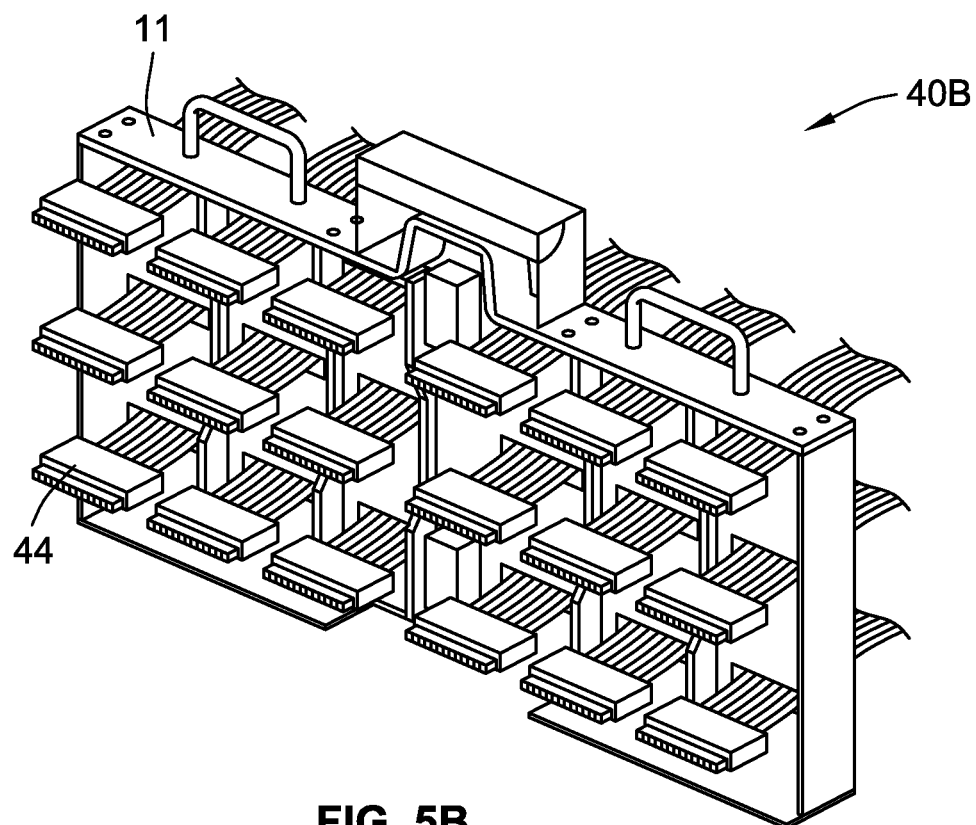
FIG. 5B is a perspective view of the bridge array of FIG. 1A with a third implementation of a connection module, according to some aspects of the present disclosure. The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

FIGS. 5A and 5B show additional implementations of the bridge array. In the bridge array 40A illustrated in FIG. 5A, the connecting member of each connection module is an add-on card connector 42. The add-on card connectors 42 are secured to frame pieces to form the connection modules, which are then coupled to the array bracket 11 to form the bridge array 40A. The add-on card connectors 42 can be used to connect to a variety of different electronic components of the computing device that are provided on add-on cards.

In the bridge array 40B, illustrated in FIG. 5B, the connecting member of each connection module is a cable connector 44. The cable connectors 44 are secured to frame pieces to form the connection modules, which are then coupled to the array bracket 11 to from the bridge array 40B. The cable connectors 44 can be used to connect any electronic components that have a cable connection.

The various implementations of the bridge array as shown herein offer greater mechanical stability to the electronic components located within the computing device. By bridging all of the electronic components using connection modules that are coupled to a single array bracket, all of the electronic components are physically secured to a single structure that can be configured to not move within the housing. This configuration provides more mechanical stability than individual bridge connectors between two components that are not secured to a larger structure.

The bridge array can also be customized depending on the specific requirements of the computing device. For example, in some implementations, the bridge array can include at least one connection module, as illustrated in FIGS. 2A and 2B, and at least one of a different type of connection module, such as the connection modules illustrated in FIG. 5A and FIG. 5B. In other implementations, the bridge array only includes a single type of connection modules.

The bridge array can be used to bridge a variety of different devices. In some implementations, a connection module can be used to bridge two or more of the same type of electronic component. In other implementations, a connection module can be used to bridge two different types of electronic components, for example a storage device (such as a hard drive) and a processing device. Further, an individual connection module can be used to bridge any number of electronic components. In some implementations, an individual connection module may be connected to only one electronic component. The connection module thus provides mechanical stability to the electronic component and can electrically connect the electronic component to one of the electrical ports of the bridge array. In this implementation however, the connection module does not connect the electronic component to any other electronic components.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A device for connecting electronic components, comprising:
   a frame member having a back panel and a pair of sides extending from the back panel;
   a connecting member attached to one of the sides of the frame member, thereby forming a connection module, the connection module being configured to physically and electrically connect a first electronic component with a second electronic component;
   an array bracket having a back side configured to at least partially receive the connection module by the back panel of the frame member being in contact with the back side of the array bracket, the array bracket further configured to at least partially receive a plurality of additional connection modules; and
   a first electrical port and a second electrical port coupled to the array bracket, wherein the first electrical port is operable to supply electrical power through the device to the first electronic component.

2. The device of claim 1, wherein each of the plurality of additional connection modules is the same as the connection module.

3. The device of claim 1, wherein the first electronic component is the same as the second electronic component.

4. The device of claim 1, wherein the first electronic component is a storage device and the second electronic component is processing device.

5. The device of claim 1, wherein the connecting member includes one or more printed circuit boards.

6. The device of claim 1, wherein the connecting member includes two printed circuit boards coupled together via the frame member.

7. The device of claim 1, wherein a first one of the plurality of additional connection modules is configured to bridge two of a first type of electronic component, and wherein a second one of the plurality of additional connection modules is configured to bridge two of a second type of electronic component, the first type of electronic component being different from the second type of electronic component.

8. The device of claim 1, wherein the connecting member includes a first electrical connector configured to receive the first electronic component, and a second electrical connector configured to receive the second electronic component.

9. The device of claim 1, wherein the connecting member is electrically coupled with the first electrical port and the second electrical port responsive to the array bracket receiving the connection module.

10. The device of claim 9, wherein the connecting member includes a first electrical connector and a second electrical connector, and wherein the first electrical connector of the connecting member is electrically connected to the first electrical port and the second electrical connector of the connecting member is electrically connected to the second electrical port responsive to the array bracket receiving the connection module.

11. The device of claim 1, wherein the connection module is configured to bridge the first electronic component and the second electronic component such that the first electronic component can transmit data to or receive data from the second electronic component.

12. A device for connecting electronic components, comprising:
   a plurality of frame members, each of the frame members having a back panel and a pair of sides extending from the back panel;
   a plurality of connecting members, each of the plurality of connecting members attached to one of the sides of a respective one of the plurality of frame members, thereby forming a plurality of connection modules configured to receive a plurality of electronic components, each of the plurality of connection modules being configured to physically and electrically connect a respective first one of the plurality of electronic components and a respective second one of the plurality of electronic components;
   an array bracket having a back side configured to receive the plurality of connection modules by the back panel of each of the frame members being in contact with the back side of the array bracket; and
   a first electrical port and a second electrical port coupled to the array bracket, wherein the first electrical port is operable to supply electrical power through the device to the first electronic component.

13. The device of claim 12, wherein each of the plurality of connecting members is electrically connected to the first electrical port and the second electrical port.

14. The device of claim 13, wherein the plurality of connecting members is configured to electrically connect each of the respective first ones of the plurality of electronic components to the first electrical port, and wherein the plurality of connecting members is configured to connect each of the respective second ones of the plurality of electronic components to the second electrical port.

15. A system for connecting electronic components, comprising:
   a housing;
   a plurality of electronic components mounted within the housing; and
   a bridge array mounted within the housing, the bridge array including:
      a plurality of frame members, each of the frame members having a back panel and a pair of sides extending from the back panel;
      a plurality of connecting members, each of the plurality of connecting members attached to one of sides of a respective one of the plurality of frame members, thereby forming a plurality of connection modules, each of the plurality of connection modules being configured to physically and electrically connect a respective first one of the plurality of electronic components and a respective second one of the plurality of electronic components;

an array bracket having a back side configured to receive the plurality of connection modules by the back panel of each of the frame members being in contact with the back side of the array bracket; and a first electrical port and a second electrical port coupled to the array, bracket, wherein the first electrical port is operable to supply electrical power to at least one of the plurality of electronic components.

16. The system of claim 15, wherein the housing is configured to slidably receive the plurality of electronic components within the housing.

17. The system of claim 15, wherein the bridge array is fixedly secured to the housing.

18. The system of claim 15, wherein the housing is configured to slidably receive the bridge array within the housing.

* * * * *